United States Patent
Hu et al.

(10) Patent No.: US 9,021,343 B1
(45) Date of Patent: Apr. 28, 2015

(54) PARITY SCHEME FOR A DATA STORAGE DEVICE

(71) Applicant: Sandisk Technologies Inc., Plano, TX (US)

(72) Inventors: Xinde Hu, San Diego, CA (US); Manuel Antonio D'Abreu, El Dorado Hills, CA (US)

(73) Assignee: Sandisk Technologies Inc., Plano, TX (US)

( * ) Notice: Subject to any disclaimer, the term of this patent is extended or adjusted under 35 U.S.C. 154(b) by 0 days.

(21) Appl. No.: 14/304,668

(22) Filed: Jun. 13, 2014

(51) Int. Cl.
G06F 11/00 (2006.01)
H03M 13/00 (2006.01)
G11C 29/00 (2006.01)
G11C 16/04 (2006.01)

(52) U.S. Cl.
CPC .......... G11C 29/785 (2013.01); G11C 16/0483 (2013.01)

(58) Field of Classification Search
USPC ................ 714/763, 801; 365/185.03, 185.11, 365/185.17
See application file for complete search history.

(56) References Cited

U.S. PATENT DOCUMENTS

| 8,839,074 B2 * | 9/2014 | Tam ............................ 714/763 |
| 2010/0268988 A1 * | 10/2010 | Kurnik et al. ................... 714/23 |
| 2012/0069664 A1 * | 3/2012 | Kim et al. ............... 365/185.11 |
| 2012/0147676 A1 * | 6/2012 | Mokhlesi et al. ........ 365/185.17 |
| 2014/0075259 A1 | 3/2014 | Tam |

OTHER PUBLICATIONS

"Raid," Wikipedia, http://en.wikipedia.org/w/index.php?title=RAID &printable=yes, printed Jun. 5, 2014, 12 pages.
Avila, Chris Nga Yee et al. "Selection of Data for Redundancy Calculation in Three Dimensional Nonvolatile Memory," U.S. Appl. No. 13/908,905, filed Jun. 3, 2013, 51 pages.
Avila, Chris et al. "Selection of Data for Redundancy Calculation in Three Dimensional Nonvolatile Memory," U.S. Appl. No. 14/281,243, filed May 19, 2014, 48 pages.

* cited by examiner

Primary Examiner — Sam Rizk
(74) Attorney, Agent, or Firm — Toler Law Group, PC

(57) ABSTRACT

A data storage device includes a non-volatile memory having a three-dimensional (3D) memory configuration. The data storage device may further include selection circuitry configured to select data for a parity operation in accordance with a parity scheme. The parity scheme may correspond to a string-based and group-based striping pattern.

20 Claims, 9 Drawing Sheets

300

|      | | | | |
|------|---|---|---|---|
| WL N+1 | 1 | 4 | 7 | 10 |
|      | 2 | 5 | 8 | 11 |
|      | 3 | 6 | 9 | 12 |

| WL N | 13 | 16 | 19 | 22 |
|------|----|----|----|----|
|      | 14 | 17 | 20 | 23 |
|      | 15 | 18 | 21 | 24 |

| WL N-1 | 1 | 4 | 7 | 10 |
|--------|---|---|---|----|
|        | 2 | 5 | 8 | 11 |
|        | 3 | 6 | 9 | 12 |

| WL N-2 | 13 | 16 | 19 | 22 |
|--------|----|----|----|----|
|        | 14 | 17 | 20 | 23 |
|        | 15 | 18 | 21 | 24 |

*FIG. 3*

PARITY SCHEME FOR A DATA STORAGE DEVICE

FIELD OF THE DISCLOSURE

The present disclosure is generally related to parity operations for data storage devices.

BACKGROUND

Non-volatile data storage devices have enabled increased portability of data and software applications. For example, multi-level cell (MLC) storage elements of a flash memory device may each store multiple bits of data, enhancing data storage density as compared to single-level cell (SLC) flash memory devices. Consequently, memory devices enable users to store and access a large amount of data.

As a number of bits stored per cell increases, errors in stored data typically increase (e.g., due to noise and other factors). A data storage device may encode and decode data using an error correcting code (ECC) technique. The ECC technique may enable error correction. For example, data may be stored with ECC information (e.g., parity bits) to enable correction of errors that may be present in the data. In some cases, data stored at a data storage device may include a large number of errors (e.g., due to noise or other factors). For example, a physical defect, such as a word line-to-word line short, may cause data corruption. In this case, an error rate of data may exceed an error correction capability associated with the particular ECC scheme used by the data storage device, which may result in data loss.

SUMMARY

A data storage device may generate parity information in accordance with a parity scheme that enables data recovery upon occurrence of an uncorrectable error correcting code (UECC) error associated with adjacent word lines of storage elements. The parity scheme may enable data recovery in the event of a defect (e.g., an electrical short) between adjacent word lines as well as upon occurrence of defects between adjacent strings.

To illustrate, a short may occur between word lines of the data storage device. In this case, data associated with the adjacent word lines or the strings may be unrecoverable using ECC techniques due to a large number of errors in the data. A parity scheme in accordance with the present disclosure selects non-adjacent word lines for parity operations (e.g., two non-adjacent word lines may belong to the same "stripe" group) so that an electrical short between adjacent word lines does not affect multiple word lines of a single stripe group. Thus, data corrupted at the adjacent word lines can be recovered using parity information associated with each stripe group and also using data from other word lines of each stripe group, such as by performing an exclusive-or (XOR) operation based on the parity information and the data from the other word lines. Further, a parity scheme may be based on string directionality. For example, adjacent strings may be associated with different stripe groups. Thus, data may be recovered in the event of a short between multiple strings (or "across" strings) (e.g., by performing a XOR operation between parity information associated with a stripe group and data from other word lines associated with the stripe group). In this example, pages associated with adjacent strings can be recovered using parity information because the strings are associated with different stripe groups. Thus, each page may be recovered using parity information and data from another word line that is not affected by the short.

BRIEF DESCRIPTION OF THE DRAWINGS

FIG. 3 illustrates an example of a string-based and group-based striping pattern;

DETAILED DESCRIPTION

Figure 1:
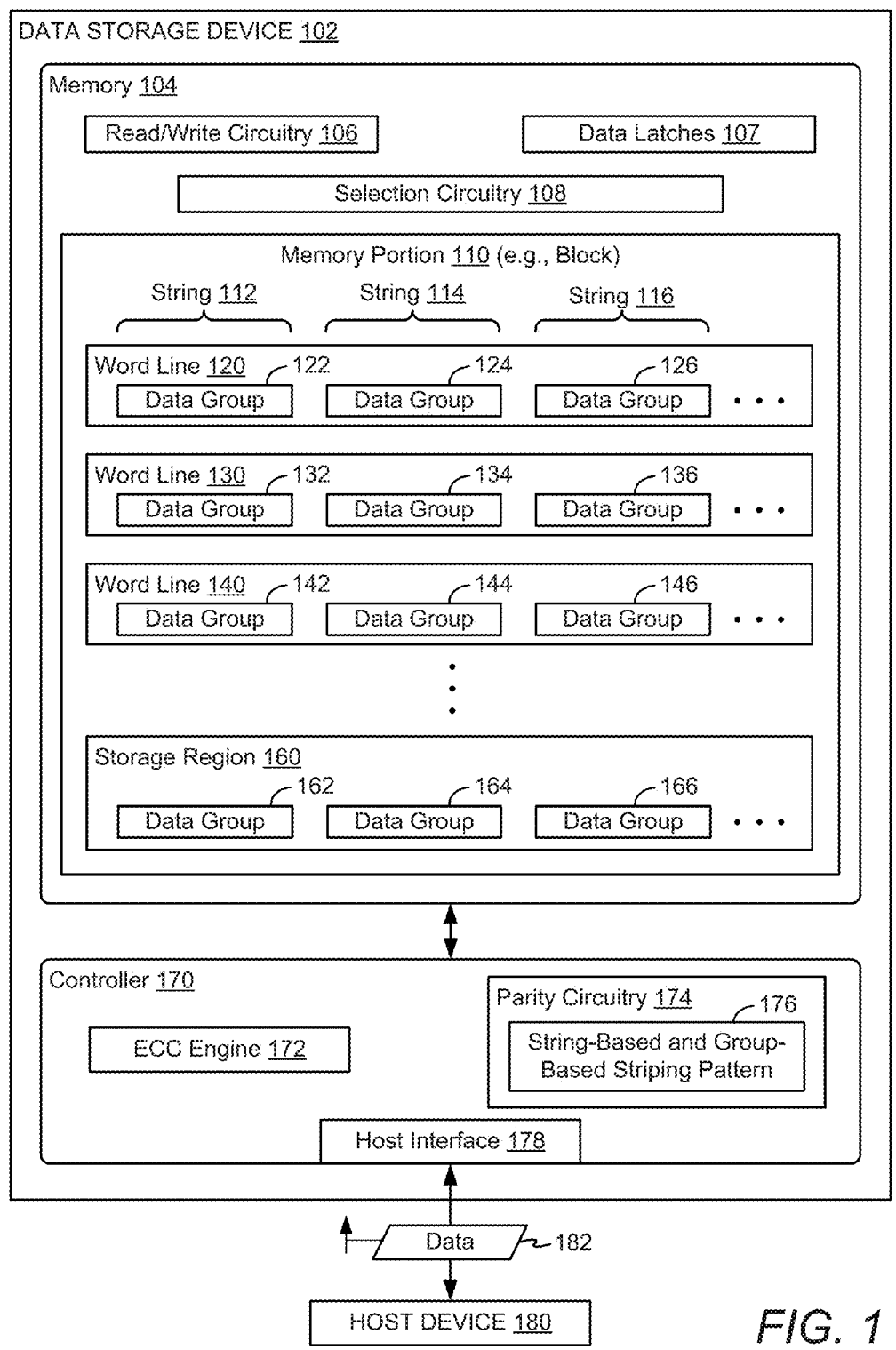
FIG. 1 is a block diagram of a particular illustrative embodiment of a system including a data storage device that is configured to perform parity operations using a string-based and group-based striping pattern.

Referring to FIG. 1, a particular illustrative embodiment of a system is depicted and generally designated 100. The system 100 includes a data storage device 102 and a host device 180. The data storage device 102 and the host device 180 may be operationally coupled via a connection, such as a bus or a wireless connection. The data storage device 102 may be embedded within the host device 180, such as in accordance with a Joint Electron Devices Engineering Council (JEDEC) Solid State Technology Association Universal Flash Storage (UFS) configuration. Alternatively, the data storage device 102 may be removable from the host device 180 (i.e., "removably" coupled to the host device 180). As an example, the data storage device 102 may be removably coupled to the host device 180 in accordance with a removable universal serial bus (USB) configuration.

The data storage device 102 may include a memory 104 and a controller 170 that is operationally coupled to the memory 104. The memory 104 may include a non-volatile memory, such as a NAND flash memory or a resistive random access memory (ReRAM). The memory 104 may have a three-dimensional (3D) memory configuration. Alternatively, the memory 104 may have another configuration, such as a two-dimensional (2D) memory configuration. In a particular implementation, the memory 104 is a non-volatile memory having a 3D memory configuration that is monolithically formed in one or more physical levels of arrays of memory cells having an active area disposed above a silicon substrate.

The memory 104 may include read/write circuitry 106, data latches 107, and selection circuitry 108 that is configured to operate according to a striping pattern. The memory 104 may further include a memory portion 110. The memory portion 110 may correspond to an erase group, or "block," of storage elements of the memory 104.

The memory portion 110 may include multiple word lines of storage elements, such as word lines 120, 130, and 140. The memory portion 110 may further include a storage region 160. The storage region 160 may correspond to one or more word lines of storage elements of a block that includes the word lines 120, 130, and 140. The memory portion 110 may include multiple strings (e.g., groups of columns of storage elements), such as strings 112, 114, and 116.

The word lines 120, 130, and 140 and the storage region 160 may include physical pages of single-level cell (SLC) storage elements that can be programmed using the read/write circuitry 106 to store threshold voltages indicating bit values of a logical page, such as in connection with a one-bit-per-cell ("X1") configuration. Alternatively, any of the word lines 120, 130, and 140 and the storage region 160 may include one or more physical pages of multi-level cell (MLC) storage elements that can be programmed using the read/write circuitry 106 to store threshold voltages indicating bit values of multiple logical pages, such as in connection with a two-bit-per-cell ("X2") configuration or a three-bit-per-cell ("X3") configuration, as illustrative examples.

The controller 170 may include an error correcting code (ECC) engine 172 and parity circuitry 174. The parity circuitry 174 may be configured to operate in accordance with a striping pattern, such as in accordance with a string-based and group-based striping pattern 176. The string-based and group-based striping pattern 176 may assign logical pages stored at the word lines 120, 130 to different stripe groups and may also assign the strings 112, 114 to different stripe groups. The parity circuitry 174 may include circuitry configured to perform exclusive-or (XOR) operations. The controller 170 may further include a host interface 178.

The ECC engine 172 is configured to receive data and to generate one or more ECC codewords based on the data. The ECC engine 172 may include a Hamming encoder, a Reed-Solomon (RS) encoder, a Bose-Chaudhuri-Hocquenghem (BCH) encoder, a low-density parity check (LDPC) encoder, a turbo encoder, an encoder configured to encode data according to one or more other ECC schemes, or a combination thereof.

The ECC engine 172 is configured to decode data accessed from the memory 104. For example, the ECC engine 172 may be configured to decode data accessed from the memory 104 to detect and correct one or more errors that may be present in the data, up to an error correcting capacity of a particular ECC scheme. The ECC engine 172 may include a Hamming decoder, an RS decoder, a BCH decoder, an LDPC decoder, a turbo decoder, a decoder configured to decode data according to one or more other ECC schemes, or a combination thereof.

The controller 170 is configured to receive data and instructions from the host device 180 and to send data to the host device 180. For example, the controller 170 may send data to the host device 180 via the host interface 178 and may receive data 182 from the host device 180 via the host interface 178.

The controller 170 is configured to send data and commands to the memory 104 and to receive data from the memory 104. For example, the controller 170 is configured to send data and a write command to cause the memory 104 to store the data to a specified address of the memory 104. The write command may specify a physical address of a portion of the memory 104 (e.g., a physical address of a word line of the memory 104) that is to store the data. The controller 170 is configured to send a read command to the memory 104 to access data from a specified address of the memory 104. The read command may specify the physical address of a portion of the memory 104 (e.g., a physical address of a word line of the memory 104).

The host device 180 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The host device 180 may communicate via a host controller, which may enable the host device 180 to communicate with the data storage device 102. The host device 180 may operate in compliance with a JEDEC Solid State Technology Association industry specification, such as an embedded MultiMedia Card (eMMC) specification or a Universal Flash Storage (UFS) Host Controller Interface specification. The host device 180 may operate in compliance with one or more other specifications, such as a Secure Digital (SD) Host Controller specification as an illustrative example. Alternatively, the host device 180 may communicate with the data storage device 102 in accordance with another communication protocol.

In operation, the controller 170 may receive data 182 and a request for write access to the memory 104 from the host device 180 via the host interface 178. The controller 170 may input the data 182 to the ECC engine 172 to generate one or more ECC codewords.

The controller 170 may store one or more logical pages to the memory 104 based on the data 182. The logical pages may correspond to ECC codewords generated by the ECC engine 172. The logical pages may be stored at the word lines 120, 130, and 140. For example, the word line 120 may store data groups 122, 124, and 126, and the data groups 122, 124, and 126 may correspond to logical pages. As another example, the word line 130 may store data groups 132, 134, and 136, and the word line 140 may store data groups 142, 144, and 146. As used herein, "data group" may refer to a logical page. Each logical page stored at the memory 104 may be addressable separately from other logical pages stored at the memory 104. For example, the data group 122 may be addressable via the string 112 separately from the data groups 124, 126, the data group 124 may be addressable via the string 114 separately from the data groups 122, 126, and the data group 126 may be addressable via the string 116 separately from the data groups 122, 124.

The parity circuitry 174 may generate parity information associated with data stored at (or scheduled to be stored at) the memory 104. The parity information may enable recovery of pages in the event of an uncorrectable error correcting code (UECC) error.

To illustrate, the parity circuitry 174 may perform parity operations based on the string-based and group-based striping pattern 176. The string-based and group-based striping pattern 176 may specify that adjacent word lines should not be included in a single stripe group and that adjacent strings should not be included in a single stripe group. The storage region 160 may be a dedicated storage region configured to store groups of parity information generated by the parity circuitry 174.

To illustrate, a parity operation may include performing a XOR operation between the data groups 122, 132 to generate a data group 162. Data may be selected for parity operations based on the string-based and group-based striping pattern 176. Depending on the particular implementation, data can be selected prior to or after being stored at the memory 104. For example, data can be selected by the controller 170 prior to sending the data to the memory 104 to be stored at the memory 104. In this case, the controller 170 may include selection circuitry corresponding to the selection circuitry 108, and the selection circuitry of the controller 170 may be configured to select data based on the string-based and group-based striping pattern 176. In another example, data can be selected by the selection circuitry 108 after being latched into the data latches 107. In another example, data can be selected by the selection circuitry 108 after being stored at the memory 104 (e.g., by causing the read/write circuitry 106 to read the data from the memory 104 into the data latches 107).

The parity circuitry 174 may perform a parity operation (e.g., a XOR operation) based on the data groups 124, 144 to generate the data group 164. The parity circuitry 174 may perform a parity operation (e.g., a XOR operation) based on the data groups 126, 146 to generate the data group 166. Accordingly, the data groups 122, 142 may be associated with a first stripe group, the data groups 124, 144 may be associated with a second stripe group, and the data groups 126, 146 may be associated with a third stripe group. The parity circuitry 174 may perform one or more other parity operations, such as XOR operations using the data groups 132, 134, and 136 with data groups of another word line (not shown in FIG. 1) to generate other parity information, which may be stored at the storage region 160.

During operation of the data storage device 102, a UECC error associated with data stored at the memory 104 may occur. For example, a defect may occur at the data storage device 102 that causes one or more UECC errors. An example of a defect is a short between adjacent word lines of the memory 104, such as a short between the word lines 120, 130, which may corrupt data at the word lines 120, 130. In this case, the ECC engine 172 may be unable to decode one or more of (or all of) the data groups 122, 124, 126, 132, 134, and 136.

The selection circuitry 108 may be configured to select data at the memory 104 for a parity operation (e.g., a XOR operation) to recover data. For example, in the event of a short between the word lines 120, 130, the data groups 122, 132 may be corrupted. In this example, the selection circuitry 108 may be configured to select the data groups 142, 162. The controller 170 may be responsive to the data groups 142, 162. For example, the controller 170 may input the data groups 142, 162 to the parity circuitry 174. The parity circuitry 174 may XOR the data groups 142, 162 to generate reconstructed data corresponding to the data group 122. In this case, the data storage device 102 may erase the data group 122 and program the reconstructed data to another portion of the memory 104 (e.g., to another word line or to another block of the memory 104).

The foregoing example may correspond to an "intra-string" short that affects storage elements of the word lines 120, 130 corresponding to the string 112 (but not storage elements of the word lines 120, 130 corresponding to the strings 114, 116). In some cases, an "inter-string" short may affect data associated with multiple strings. For example, a short may affect the data groups 122, 124, 132, and 134, which may result in UECC errors associated with one or more of the data groups 122, 124, 132, and 134.

The selection circuitry 108 may be configured to select data stored at the memory 104 to enable data recovery. To illustrate, the selection circuitry 108 may select the data groups 142, 162 to enable recovery of the data group 122 by the parity circuitry 174 and may further select the data groups 144, 164 to enable recovery of the data group 124 by the parity circuitry 174. Similarly, data groups of the word line 130 may be recovered using data groups from another word line (not shown in FIG. 1) and parity information generated based on the data groups of the word line 130 and the other word line (not shown in FIG. 1).

FIG. 1 illustrates techniques for data recovery in the event of intra-string shorts and/or inter-string shorts. For example, because the data groups 122, 132 are associated with different stripe groups, data lost as a result of an intra-string short associated with the string 112 and the word lines 120, 130 can be recovered using the data groups 142, 162. As another example, because the data groups 122, 124, 132, and 134 are associated with different stripe groups, data lost as a result of an inter-string short between the strings 112, 114 and the word lines 120, 130 can be recovered using the data groups 142, 144, 162, 164. Thus, data recovery is enabled at the data storage device in the event of intra-string shorts and/or inter-string shorts.

Figure 2:
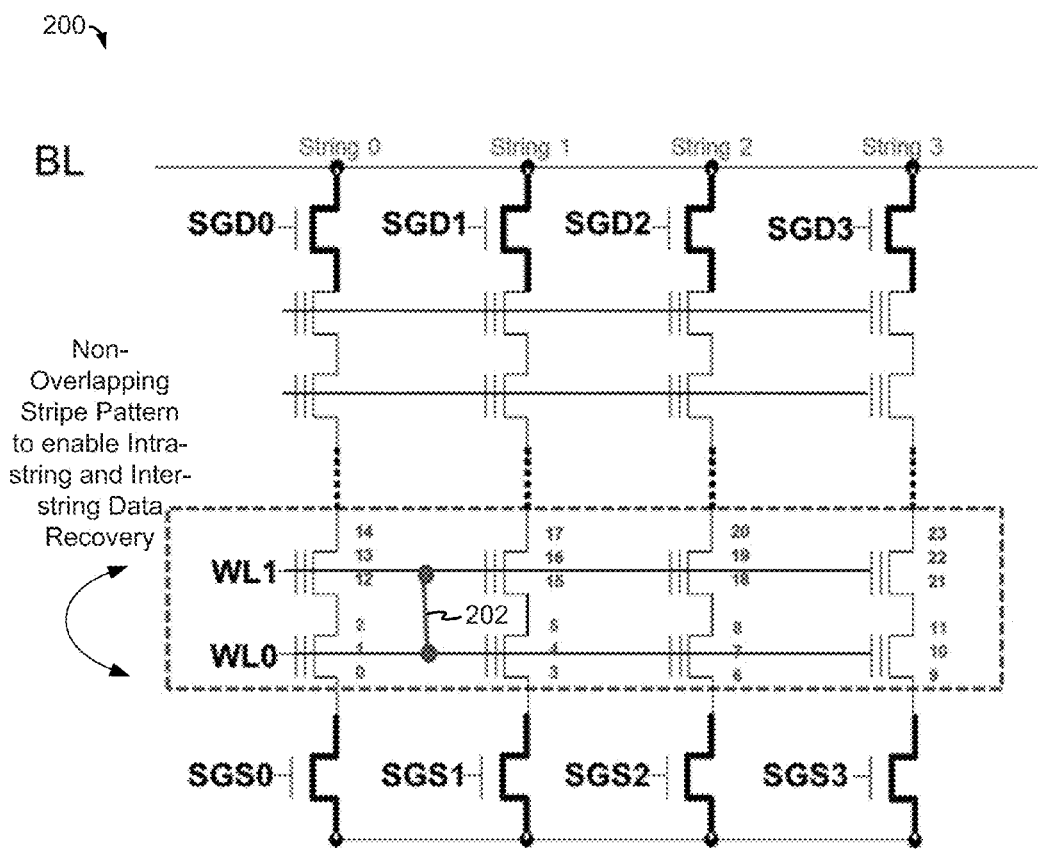
FIG. 2 is a diagram of a particular illustrative embodiment of a portion of a memory of the data storage device of FIG. 1.

Referring to FIG. 2, a particular illustrative embodiment of a device is depicted and generally designated 200. The device 200 may be integrated within the memory 104 of FIG. 1. For example, the device 200 may correspond to the memory portion 110 of FIG. 1.

The device 200 may include one or more bit lines, such as a bit line BL. The device 200 may further include multiple strings, such as a string 0, a string 1, a string 2, and a string 3. The device 200 may include multiple word lines, such as a word line WL0 and a word line WL1. The strings 0, 1, 2, and 3 may correspond to any of the strings 112, 114, and 116 of FIG. 1. For example, the strings 0, 1, and 2 may correspond to the strings 112, 114, and 116, respectively. As another example, the strings 1, 2, and 3 may correspond to the strings 112, 114, and 116, respectively. The word lines WL0, WL1 may correspond to the word lines 120, 130, as an illustrative example. For convenience, groups of storage elements of the word lines WL0, WL1 are illustrated as a transistor (for ease of illustration). It should be appreciated that FIG. 2 is illustrative and that each transistor depicted in FIG. 2 may correspond to multiple storage elements (e.g., hundreds of storage elements or thousands of storage elements).

The device 200 may further include one or more select gate drain (SGD) transistors, such as representative transistors SGD0, SGD1, SGD2, and SGD3. The device 200 may further include one or more select gate source (SGS) transistors, such as representative transistors SGS0, SGS1, SGS2, and SGS3. Gate terminals of the transistors SGD0-3 and gate terminals of the transistors SGS0-3 may be controlled by circuitry (not shown in FIG. 2), such as by the selection circuitry 108 of FIG. 1, as an illustrative example.

In the example of FIG. 2, the device 200 corresponds to a three-bit-per-cell ("X3") storage device. For example, FIG. 2 illustrates that the word line WL0 may store multiple lower pages (e.g., pages 0, 3, 6, and 9), multiple middle pages (e.g., pages 1, 4, 7, and 10), and multiple upper pages (e.g., pages 2, 5, 8, 11). FIG. 2 further illustrates that the word line WL1 may store multiple lower pages (e.g., pages 12, 15, 18, and 21), multiple middle pages (e.g., pages 13, 16, 19, and 22), and multiple upper pages (e.g., pages 14, 17, 20, and 23). Each of the pages 0-23 may correspond to a logical page of data, such as an ECC codeword generated by the ECC engine 172 of FIG. 1. It should be appreciated that in other implementations, the device 200 may be a single-level cell (SLC) device or another multi-level cell (MLC) device, such as a two-bit-per-cell ("X2") device, as an illustrative example.

During operation of the device 200, the pages 0-23 may be associated with a non-overlapping striping pattern to enable intra-string and inter-string data recovery. The striping pattern may correspond to a string-based and group-based striping pattern that assigns logical pages stored at the word lines WL0 and WL1 to different stripe groups and that assigns strings of the device 200 to different stripe groups. For example, each of the pages 0-23 may be grouped into a corresponding one of 24 stripe groups. In a particular embodiment, the parity circuitry 174 of FIG. 1 is configured to perform 24 parity operations based on the pages 0-23. For example, each of the pages 0-11 may be XORed with pages from another word line that is non-adjacent to the word line WL0, and each of the pages 12-23 may be XORed with pages from another word line that is non-adjacent to the word line WL1. Accordingly, because each of the pages 0-23 is associated with a respective stripe group, each of the pages 0-23 can be recovered in the event of a defect associated with the word lines WL0 and WL1, such as a short 202.

The example of FIG. 2 illustrates that a striping pattern may enable data recovery in the event of intra-string shorts and/or inter-string shorts. For example, the non-overlapping stripe pattern of FIG. 2 may enable data recovery in the event of an intra-string short associated with the string 0 (e.g., a short affecting the pages 0-2 and 12-14) and may further enable data recovery in the event of an inter-string short affecting the strings 0 and 1 (e.g., a short affecting the pages 0-5 and 12-17). Thus, data loss can be avoided in certain circumstances.

Referring to FIG. 3, an example string-based and group-based striping pattern for an illustrative three-bit-per-cell ("X3") configuration is depicted and generally designated 300. The data storage device 102 of FIG. 1 may operate in accordance with the striping pattern 300. For example, the parity circuitry 174 may be configured to perform parity operations in accordance with the striping pattern 300, and the selection circuitry 108 may be configured to select data for parity operations based on the striping pattern 300.

In FIG. 3, each numeral 1, 2, 3, . . . 24 indicates a stripe group. FIG. 3 further illustrates that alternating word lines may be selected for parity operations based on the stripe groups. For example, pages of a word line WL N−2 (where N is an integer) and pages of a word line WL N may be selected for parity operations. As another example, pages of a word line WL N−1 and pages of a word line WL N+1 may be selected for parity operations. Any of the word lines WL N−2, WL N−1, and WL N+1 of FIG. 3 may correspond to any of the word lines 120, 130, and 140 of FIG. 1.

The example of FIG. 3 illustrates an example striping pattern 300 that may enable recovery of data stored using a three-bit-per-cell technique at a data storage device. The striping pattern 300 may enable data recovery in response to data-corrupting events, such as a word line-to-word line short that may cause one or more UECC errors. Thus, by using the striping pattern 300, data loss may be avoided in some circumstances (e.g., after certain data corrupting events). An example of a two-bit-per-cell data striping pattern is described with reference to FIG. 4.

Figure 4:
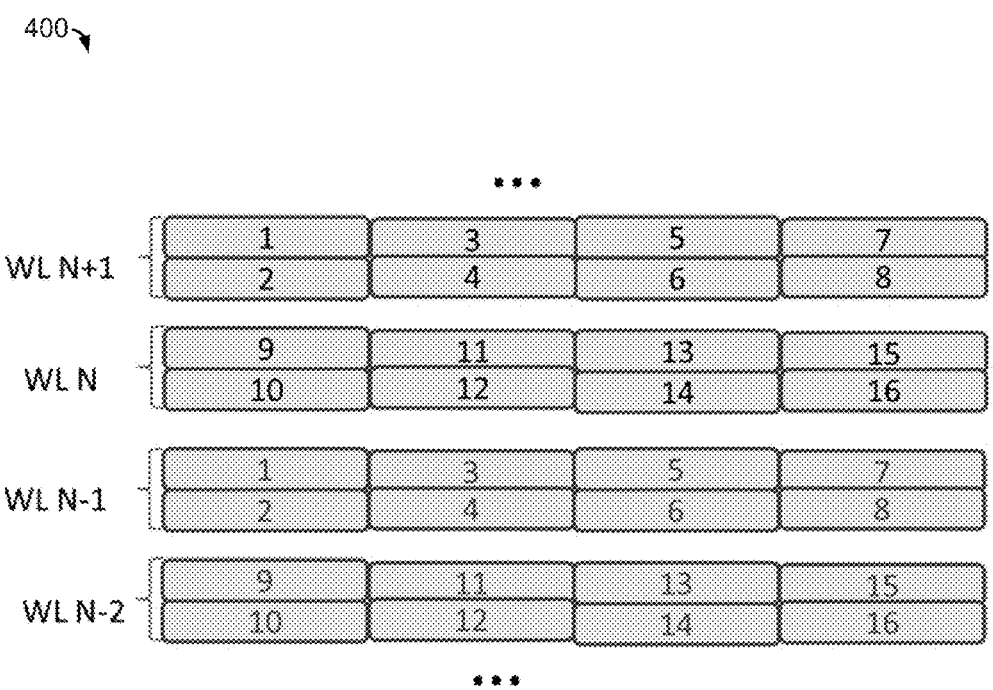
FIG. 4 illustrates another example of a string-based and group-based striping pattern.

Referring to FIG. 4, an example string-based and group-based striping pattern for an illustrative two-bit-per-cell ("X2") configuration is depicted and generally designated 400. The data storage device 102 of FIG. 1 may operate in accordance with the striping pattern 400. For example, the parity circuitry 174 may be configured to perform parity operations in accordance with the striping pattern 400, and the selection circuitry 108 may be configured to select data for parity operations based on the striping pattern 400.

In FIG. 4, each numeral 1, 2, 3, . . . 16 indicates a stripe group. FIG. 4 further illustrates that alternating word lines may be selected for parity operations based on the stripe groups. For example, pages of a word line WL N−2 and pages of a word line WL N may be selected for parity operations. As another example, pages of a word line WL N−1 and pages of a word line WL N+1 may be selected for parity operations. Any of the word lines WL N−2, WL N−1, WL N, and WL N+1 of FIG. 4 may correspond to any of the word lines 120, 130, and 140 of FIG. 1.

The example of FIG. 4 illustrates an example striping pattern 400 that may enable recovery of data stored using a two-bit-per-cell technique at a data storage device. The striping pattern 400 may enable data recovery in response to data-corrupting events, such as a word line-to-word line short that may cause one or more UECC errors. Thus, by using the striping pattern 400, data loss may be avoided in some circumstances.

Figure 5:
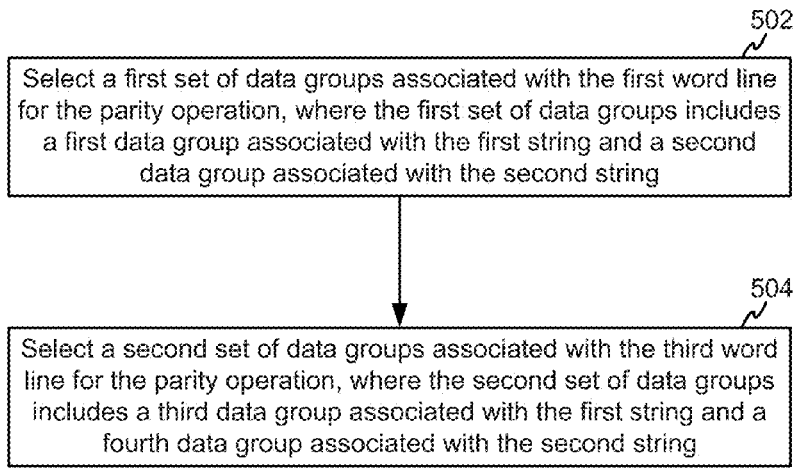
FIG. 5 is a flow diagram that illustrates a particular exemplary method of operation of the data storage device of FIG. 1.

Referring to FIG. 5, a particular illustrative embodiment of a method is depicted and generally designated 500. The method 500 may be performed at a data storage device (e.g., the data storage device 102) that includes a non-volatile memory (e.g., the memory 104) having a three-dimensional (3D) memory configuration. The non-volatile memory includes multiple word lines. The multiple word lines may include a first word line (e.g., the word line 120), a second word line (e.g., the word line 130), and a third word line (e.g., the word line 140). The first word line is adjacent to the second word line, and the second word line is adjacent to the third word line. The non-volatile memory further includes multiple strings. The multiple strings may include a first string (e.g., the string 112) and a second string (e.g., the string 114). The first string is adjacent to the second string. It should be appreciated that a memory may include more than three word lines and/or more than three strings.

The method 500 includes selecting a first set of data groups associated with the first word line for a parity operation, at 502. As an example, the first set of data groups includes a first data group (e.g., the data group 122) associated with the first string and a second data group (e.g., the data group 124) associated with the second string. Depending on the particular implementation, the first set of data groups can be selected prior to or after being stored at the memory 104. For example, the first set of data groups can be selected by the controller 170 prior to sending the first set of data groups to the memory 104 to be stored at the memory 104. In another example, the first set of data groups can be selected by the selection circuitry 108 after being latched into the data latches 107. In another example, the first set of data groups can be selected by the selection circuitry 108 after being stored at the memory 104 (e.g., by causing the read/write circuitry 106 to read the first set of data groups from the memory 104 into the data latches 107).

The method 500 further includes selecting a second set of data groups associated with the third word line for the parity operation, at 504. The second set of data groups includes a third data group (e.g., the data group 142) associated with the first string and a fourth data group (e.g., the data group 144) associated with the second string. Depending on the particular implementation, the second set of data groups can be selected prior to or after being stored at the memory 104. For example, the second set of data groups can be selected by the controller 170 prior to sending the second set of data groups to the memory 104 to be stored at the memory 104. In another example, the second set of data groups can be selected by the selection circuitry 108 after being latched into the data latches 107. In another example, the second set of data groups can be selected by the selection circuitry 108 after being stored at the memory 104.

The method 500 may further include performing a parity operation. Performing the parity operation may include generating first parity information based on the first data group and the third data group and may further include generating second parity information based on the second data group and the fourth data group. For example, the first parity information may correspond to the data group 162, and the second parity information may correspond to the data group 164. In a particular embodiment, performing the parity operation includes performing multiple exclusive-or (XOR) operations. The multiple XOR operations may include a first XOR operation based on the first data group and the third data group to generate the first parity information (e.g., by XORing the data groups 122, 142 to generate the data group 162). The multiple XOR operations may further include a second XOR operation based on the second data group and the fourth data group (e.g., by XORing the data groups 124, 142 to generate the data group 164). In a particular embodiment, the XOR operations are performed by the parity circuitry 174.

The method 500 may be performed at a data storage device having an MLC configuration. To illustrate, the multiple word lines may be MLC word lines (i.e., word line groups of MLC storage elements). The first data group may correspond to a first logical page of a first set of MLC pages associated with the first string, the second data group may correspond to a second logical page of a second set of MLC pages associated with the second string, the third data group may correspond to a third logical page of a third set of MLC pages associated with the first string, and the fourth data group may correspond to a fourth logical page of a fourth set of MLC pages associated with the second string.

As an illustrative, non-limiting example, the first data group may correspond to one of the pages 0-2 of FIG. 2, the second data group may correspond to one of the pages 3-5 of FIG. 2, the third data group may correspond to one of the pages 12-14 of FIG. 2, and the fourth data group may correspond to one of the pages 15-17 of FIG. 2. In this example, the MLC word lines are three-bit-per-cell (X3) MLC word lines. In this case, the selection circuitry 108 may be configured to operate based on a striping pattern that includes 24 stripes (e.g., the 24 stripes illustrated in FIG. 3).

In another example, the MLC word lines are two-bit-per-cell (X2) MLC word lines. In this case, the selection circuitry 108 may be configured to operate based on a striping pattern that includes 16 stripes (e.g., the 16 stripes illustrated in FIG. 2). Alternatively, the method 500 may be performed at a data storage device having a different configuration, such as a single-level cell (SLC) configuration or another MLC configuration (e.g., more than three bits per cell).

The method 500 of FIG. 5 may enable data recovery at a data storage device. For example, the method 500 may enable use of a string-based and group-based stripe pattern to enable data recovery in case of data-corrupting events, such as a word line-to-word line short.

Figure 6:
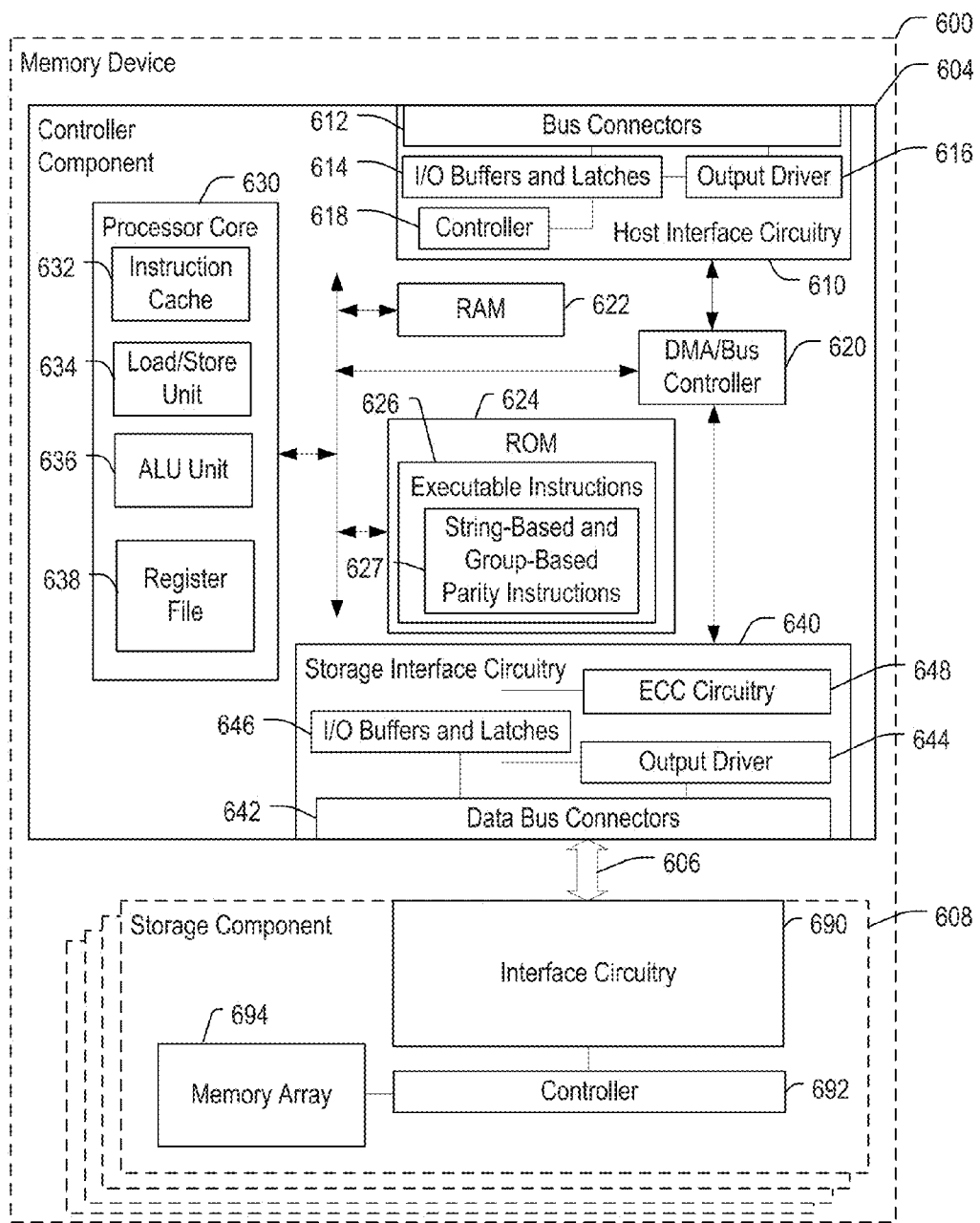
FIG. 6 is a block diagram of a particular embodiment of a memory device that may be included in the data storage device of FIG. 1.

Referring to FIG. 6, an illustrative embodiment of a memory device is depicted and generally designated 600. The memory device 600 includes a controller component 604 coupled to one or more storage components, such as a representative storage component 608, via a bus 606. The representative storage component 608 includes interface circuitry 690 to communicate via the bus 606. The storage component 608 also includes a controller 692 that is coupled to the interface circuitry 690 and that is also coupled to a memory, such as a memory array 694. The memory array 694 may include one or more types of storage media, such as a 3D NAND array or a ReRAM array. The memory array 694 may have a 3D memory configuration. Alternatively, the memory array 694 may have another configuration, such as a 2D memory configuration. In a particular embodiment, the memory device 600 may correspond to the data storage device 102 of FIG. 1.

In a particular embodiment, the controller component 604 includes host interface circuitry 610 coupled to a direct memory access (DMA)/bus controller 620. The controller component 604 also includes storage interface circuitry 640 that is coupled to the DMA/bus controller 620. A processor core 630, a random access memory (RAM) 622 and a read-only memory (ROM) 624 are coupled to the DMA/bus controller 620 via an internal bus.

In a particular embodiment, the host interface circuitry 610 includes bus connectors 612 coupled to input/output (I/O) buffers and latches 614. The bus connectors 612 are further coupled to output driver circuitry 616. The host interface circuitry 610 also includes a controller 618. In a particular embodiment, the host interface circuitry 610 operates in accordance with a universal serial bus (USB) protocol. For example, the controller 618 may be programmed to receive USB protocol instructions and data from a host device (not shown) via the bus connectors 612 that are coupled to a universal serial bus. The controller 618 may include a hardware processor that executes instructions stored at an internal memory, such as a read-only memory (not shown) to enable receipt and acknowledgment of USB instructions and data. Alternatively, or in addition, the host interface circuitry 610 may be configured to support other communication protocols, such as a Secure Digital (SD) protocol, a small computer system interface (SCSI), parallel interface (SPI), a Compact Flash (CF) protocol, one or more other protocols, or any combination thereof.

In a particular embodiment, the processor core 630 includes an instruction cache 632, a load/store unit 634, an arithmetic logic unit (ALU) unit 636, and a register file 638. The processor core 630 may include, or may function substantially similarly to, an ARM core, as an illustrative, non-limiting example. For example, the processor core 630 may support a reduced instruction set computer (RISC) microarchitecture. The processor core 630 may be configured to retrieve data and executable instructions 626 via the load/store unit 634 from the ROM 624. The executable instructions 626 may be executable by the processor core 630 to perform one or more operations described herein. For example, the executable instructions 626 may include string-based and group-based parity instructions 627 executable by the processor core 630 to perform one or more parity operations described herein, such as XOR operations. It should be appreciated that parity operations (such as XOR operations) may be performed using hardware (e.g., logic gates) alternatively or in addition to using executing instructions to perform such operations.

Alternatively, or in addition, at least some of the executable instructions 626 may not be stored at the ROM 624 and may be stored at the memory array 694. The executable instructions 626 may be retrieved from the memory array 694 and stored at the RAM 622. The processor core 630 may be configured to retrieve the executable instructions 626 from the RAM 622 for execution.

The executable instructions 626 may be retrieved by the load/store unit 634 and stored to the instruction cache 632. The ALU unit 636 may include dedicated circuitry to perform arithmetic and logic operations, such as addition and subtraction, AND, NOT, OR, exclusive-OR (XOR), other arithmetic or logic operations, or any combination thereof. For example, the controller component 604 may utilize the ALU unit 636 may to perform string-based and group-based parity operations alternatively or in addition to using the string-based and group-based parity instructions 627.

The register file 638 may include multiple memory cells that may provide high speed access to the processor core 630 of data to be used for execution of instructions. One or more memory cells at the register file 638 may be dedicated to store a status indicator. Additional data values, such as values to indicate memory type, memory write status, and write protect status, may also be set during execution of the executable instructions 626 at the processor core 630.

The storage interface circuitry 640 may include data bus connectors 642, an output driver 644, input/output buffers and latches 646, and ECC circuitry 648. The data bus connectors 642 may include electrical connectors to enable electrical signal propagation via the bus 606. The I/O buffers and latches 646 may be configured to store data that is received via the DMA/bus controller 620 to be transmitted via the bus 606 using electrical signals at the data bus connectors 642 that are generated by the output driver 644. In addition, or alternatively, the I/O buffers and latches 646 may store data values represented by electrical signals received at the data bus connectors 642 via the bus 606, such as signals generated by the interface circuitry 690 of the storage component 608.

The ECC circuitry 648 may correspond to the ECC engine 172 of FIG. 1. The ECC circuitry 648 may include dedicated hardware and circuitry configured to perform operations using data and error correcting code information corresponding to the data that are received as a result of a memory read from the storage component 608, and may perform logical or arithmetic operations to verify that the received data is not detected to have corrupted values. For example, the received data may include additional bits representing an error correcting code, which may be encoded based on values of the data upon storage at the memory array 694. Corruption of one or more bits of the data, or one or more bits of the error correcting code, may be detectable by the ECC circuitry 648. For example, the storage interface circuitry 640 may include a flash memory interface, and the ECC circuitry 648 may be compliant with one or more flash error correcting code protocols.

Figure 7:
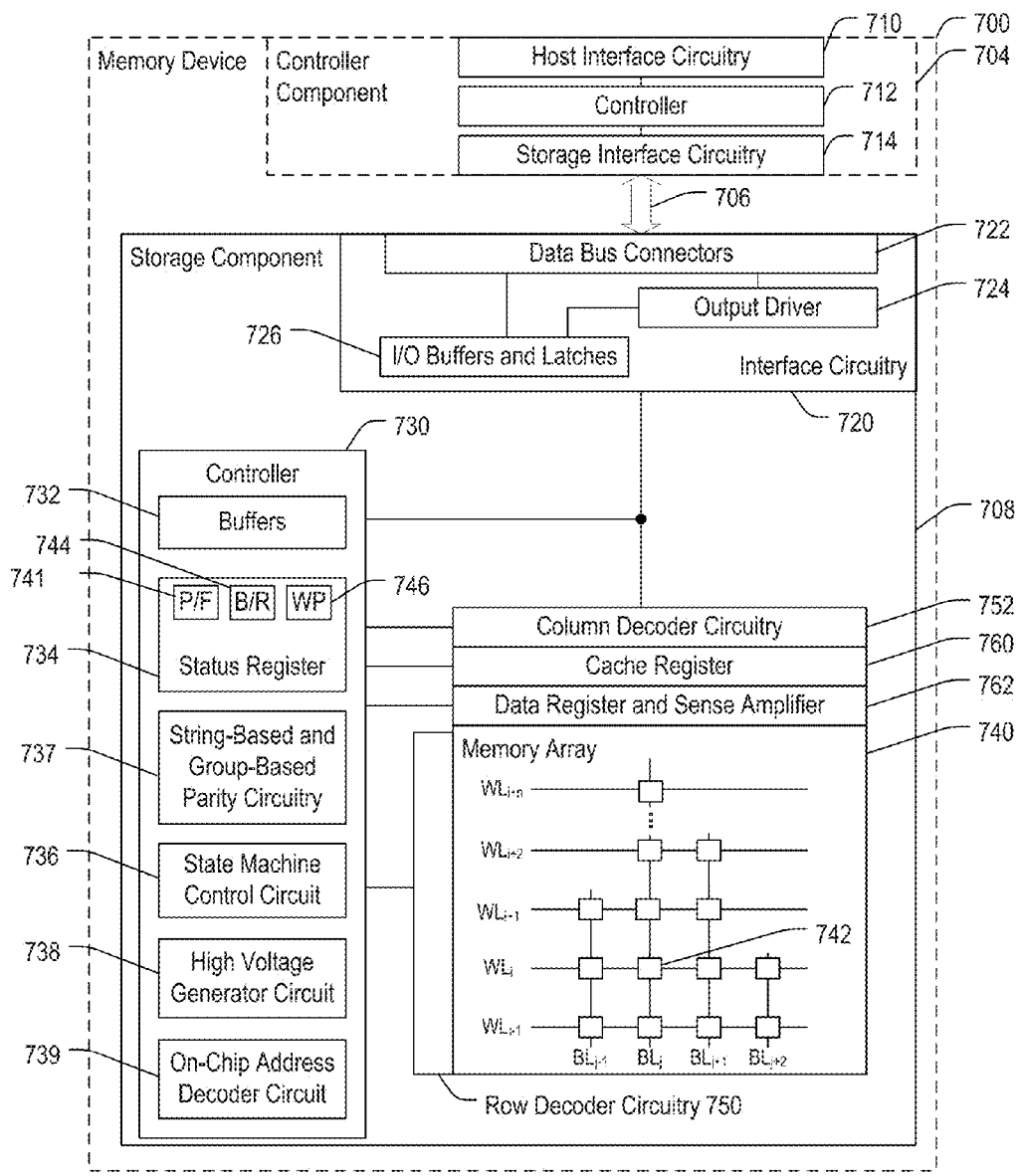
FIG. 7 is a block diagram of another particular embodiment of a memory device that may be included in the data storage device of FIG. 1.

Referring to FIG. 7, an illustrative embodiment of a memory device is depicted and generally designated 700. The memory device 700 a controller component 704 coupled to a storage component 708. In a particular embodiment, the memory device 700 may correspond to the data storage device 102 of FIG. 1. For example, the controller component 704 may correspond to the controller 170 of FIG. 1, and the storage component 708 may correspond to the memory 104 of FIG. 1. The storage component 708 may have a 3D memory configuration. Alternatively, the storage component 708 may have another configuration, such as a 2D memory configuration.

The controller component 704 may include host interface circuitry 710, a controller 712, and storage interface circuitry 714. The controller component 704 may be coupled to the storage component 708 via a data bus 706, such as an 8-bit or 16-bit parallel data bus, as an illustrative, non-limiting example. The controller component 704 may communicate instructions and data with an external host (not shown) via the host interface circuitry 710. The controller 712 may be configured to respond to instructions received by the host interface circuitry 710 and may also be configured to send and receive data and instructions to the storage component 708 via the storage interface circuitry 714.

In a particular embodiment, the storage component 708 includes interface circuitry 720, a controller 730 coupled to the interface circuitry 720, and a memory array 740 accessible to the controller 730. The storage component 708 may include one or more sets of row decoder circuitry, such as row decoder circuitry 750. The storage component may further include column decoder circuitry 752. The row decoder circuitry 750 and the column decoder circuitry 752 may enable access to data stored at one or more particular rows and particular columns of the memory array 740, such as to read a value from or to write a value to a particular memory cell 742 at a bit line $BL_j$ and at word line $WL_i$. A cache register 760 and a data register and sense amplifier 762 may further be coupled to the memory array 740 and may be used to cache or to temporarily store data that is to be written to the memory array 740 or data that has been read out of the memory array 740. In a particular embodiment, the memory array 740 may include a flash memory or a ReRAM. The memory array 740 may have a 3D memory configuration.

In a particular embodiment, the controller 730 includes one or more buffers 732 to store instructions, data, or any combination thereof. The controller 730 may also include one or more status registers 734, a state machine control circuit 736, string-based and group-based parity circuitry 737, a high voltage generator circuit 738, and an on-chip address decoder circuit 739. The string-based and group-based parity circuitry 737 may be configured to perform "in-memory" parity operations at the storage component 708, which may reduce or avoid transfer of data between the controller component 704 and the storage component 708 during parity operations in some circumstances.

The controller 730 may be coupled to provide electrical signals to the row decoder circuitry 750, to the column decoder circuitry 752, to the cache register 760, and to the data register and sense amplifier 762. In a particular embodiment, the controller 730, including one or more of the buffers 732, the status register 734, the state machine control circuit 736, the high-voltage generation circuit 738, and the on-chip address decoder circuit 739, in conjunction with the interface circuitry 720 and the memory array 740, may be configured to perform at least a portion of the method 500 of FIG. 5. Alternatively or in addition, the controller 712 may be configured to perform one or more operations of the method 500 of FIG. 5.

In a particular embodiment, the status register 734 of the controller 730 may include one or more indicators storing values, such as a pass/fail (P/F) value 741, a busy/ready (B/R) value 744, a write protect (WP) value 746, one or more other indicators, or a combination thereof. The status register 734 may be accessible to the state machine control circuit 736.

The state machine control circuit 736 may include dedicated hardware and circuitry to control an operation of the controller 730 in response to one or more received instructions and internal states, such as may be represented at the status register 734. The state machine control circuit 736 may include states such as a read status state, a data write state, a data read state, as illustrative, non-limiting examples.

In a particular embodiment, the high voltage generator circuit 738 may be responsive to the state machine control circuit 736 and may be configured to generate a high voltage to program values to, or erase values from, the memory array 740. For example, the memory array 740 may be a flash memory or other memory that may be programmable or erasable via a "high" voltage, such as, for example, five volts (V). Alternatively, the memory array 740 may include a ReRAM. The memory array 740 may have a 3D memory configuration, such as a vertical 3D memory configuration (e.g., a vertical 3D NAND flash memory configuration). The controller 730 may also include the on-chip address decoder circuit 739 that may include hardware and logic circuitry to receive memory address information from the controller component 704 and to decode the memory address information to specific rows and columns to be provided to the row decoder circuitry 750 and the column decoder circuitry 752.

The interface circuitry 720 may include data bus connectors 722, an output driver 724 coupled to the data bus connectors 722, and input/output (I/O) buffers and latches 726. The I/O buffers and latches 726 may be configured to store or to latch data that is received via the data bus connectors 722 or data that is to be written to the data bus 706 via the data bus connectors 722. The data bus connector 722 may include physical electrical connectors that couple the interface circuitry 720 to the data bus 706. The output driver 724 may include dedicated circuitry and electrical connections to enable the interface circuitry 720 to drive electrical signals over the data bus 706. In a particular embodiment, the interface circuitry 720 is configured to comply with one or more bus communications protocols or standards.

Figure 8:
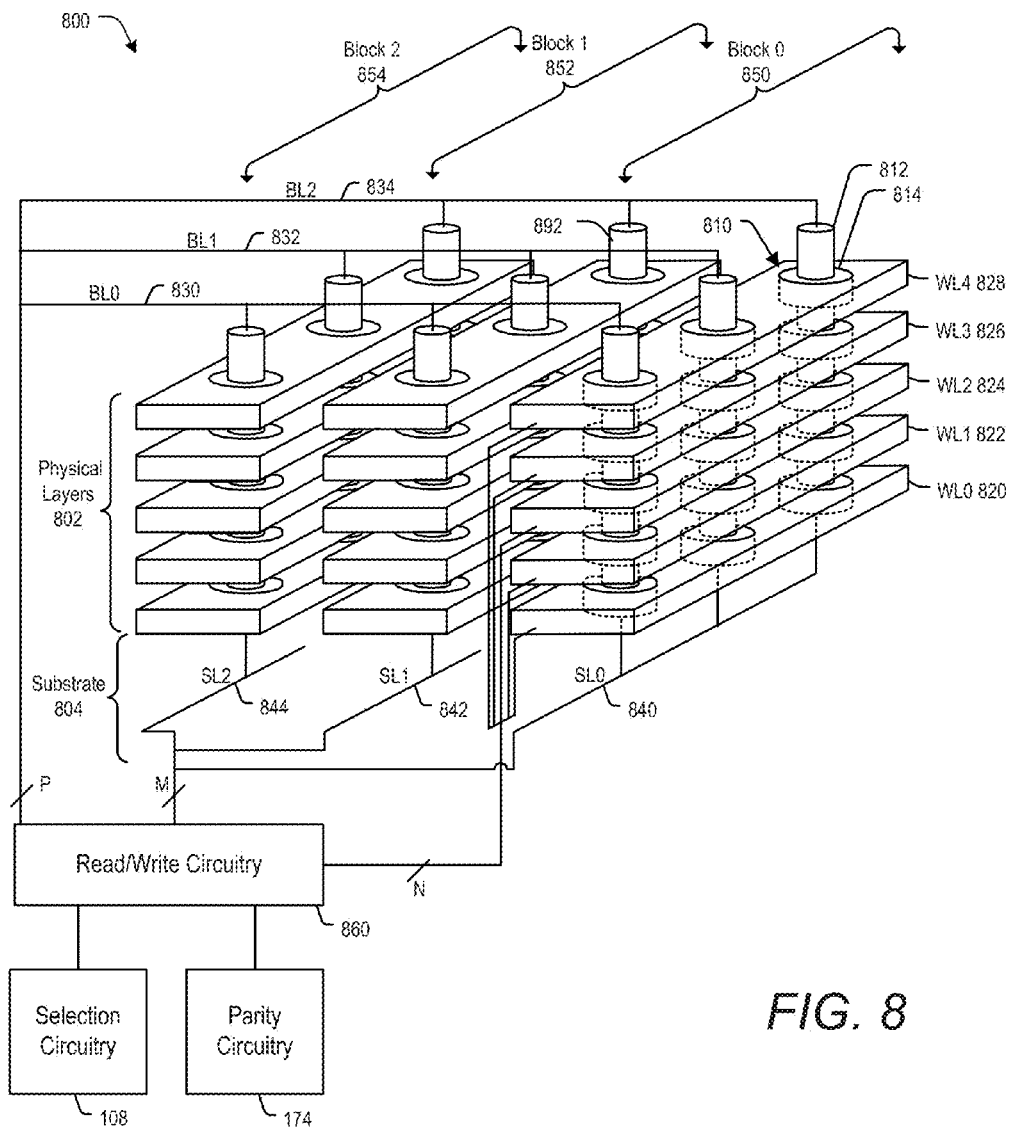
FIG. 8 is a block diagram of a particular embodiment of a memory that may be included in the data storage device of FIG. 1.

FIG. 8 illustrates an embodiment of a 3D memory 800 in a NAND flash configuration. The 3D memory 800 may correspond to the memory 104 of FIG. 1. The 3D memory 800 may include the selection circuitry 108 of FIG. 1 and the parity circuitry 174 of FIG. 1 (e.g., in connection with an "in-memory" parity scheme). The selection circuitry 108 and the parity circuitry 174 are configured to operate (e.g., to select data and/or to perform parity operations) based on the string-based and group-based striping pattern 176 described with reference to FIG. 1.

The 3D memory 800 includes multiple physical layers, such as a group of physical layers 802. The multiple physical layers are monolithically formed above a substrate 804, such as a silicon substrate. Storage elements (e.g., memory cells), such as a representative memory cell 810, are arranged in arrays in the physical layers.

The representative memory cell 810 includes a charge trap structure 814 between a word line/control gate (WL4) 828 and a conductive channel 812. Charge may be injected into or drained from the charge trap structure 814 via biasing of the conductive channel 812 relative to the word line 828. For example, the charge trap structure 814 may include silicon nitride and may be separated from the word line 828 and the conductive channel 812 by a gate dielectric, such as silicon oxide. An amount of charge in the charge trap structure 814 affects an amount of current through the conductive channel 812 during a read operation of the memory cell 810 and indicates one or more bit values that are stored in the memory cell 810.

The 3D memory 800 includes multiple erase blocks, including a first block (block 0) 850, a second block (block 1) 852, and a third block (block 2) 854. Each block 850-854 includes a "vertical slice" of the physical layers 802 that includes a stack of word lines, illustrated as a first word line (WL0) 820, a second word line (WL1) 822, a third word line (WL2) 824, a fourth word line (WL3) 826, and a fifth word line (WL4) 828. Multiple conductive channels (having a substantially vertical orientation with respect to FIG. 8) extend through the stack of word lines. Each conductive channel is coupled to a storage element in each word line 820-828, forming a NAND string of storage elements. FIG. 8 illustrates three blocks 850-854, five word lines 820-828 in each block, and three conductive channels in each block for clarity of illustration. However, the 3D memory 800 may have more than three blocks, more than five word lines per block, and more than three conductive channels per block.

Read/write circuitry 860 is coupled to the conductive channels via multiple conductive lines, illustrated as a first bit line (BL0) 830, a second bit line (BL1) 832, and a third bit line (BL2) 834 at a "top" end of the conducive channels (e.g., farther from the substrate 804) and a first source line (SL0) 840, a second source line (SL1) 842, and a third source line (SL2) 844 at a "bottom" end of the conductive channels (e.g., nearer to or within the substrate 804). The read/write circuitry 860 is illustrated as coupled to the bit lines 830-834 via "P" control lines, coupled to the source lines 840-844 via "M" control lines, and coupled to the word lines 820-828 via "N" control lines. Each of P, M, and N may have a positive integer value based on the specific configuration of the 3D memory 800. In the illustrative example of FIG. 8, P=3, M=3, and N=5.

In a particular embodiment, each of the bit lines and each of the source lines may be coupled to the same end (e.g., the top end or the bottom end) of different conductive channels. For example, a particular bit line may be coupled to the top of a conductive channel 892 and a particular source line may be coupled to the top of the conductive channel 812. The bottom of the conductive channel 892 may be coupled (e.g., electrically coupled) to the bottom of the conductive channel 812. Accordingly, the conductive channel 892 and the conductive channel 812 may be coupled in series and may be coupled to the particular bit line and the particular source line.

The read/write circuitry 860 may operate as described with respect to the read/write circuitry 106 of FIG. 1. For example, data may be stored to storage elements coupled to the word line 828 and the read/write circuitry 860 may read bit values from the storage elements. As another example, the read/write circuitry 860 may apply selection signals to control lines coupled to the word lines 820-828, the bit lines 830-834, and the source lines 840-842 to cause a programming voltage (e.g., a voltage pulse or series of voltage pulses) to be applied across selected storage element(s) of the selected word line (e.g., the fourth word line 828).

During a read operation, the controller 170 may receive a request from a host device, such as the host device 180 of FIG. 1. The controller 170 may cause the read/write circuitry 860 to read bits from particular storage elements of the 3D memory 800 by applying appropriate signals to the control lines to cause storage elements of a selected word line to be sensed. Accordingly, the 3D memory 800 may be configured to read from and write data to one or more storage elements.

Figure 9:
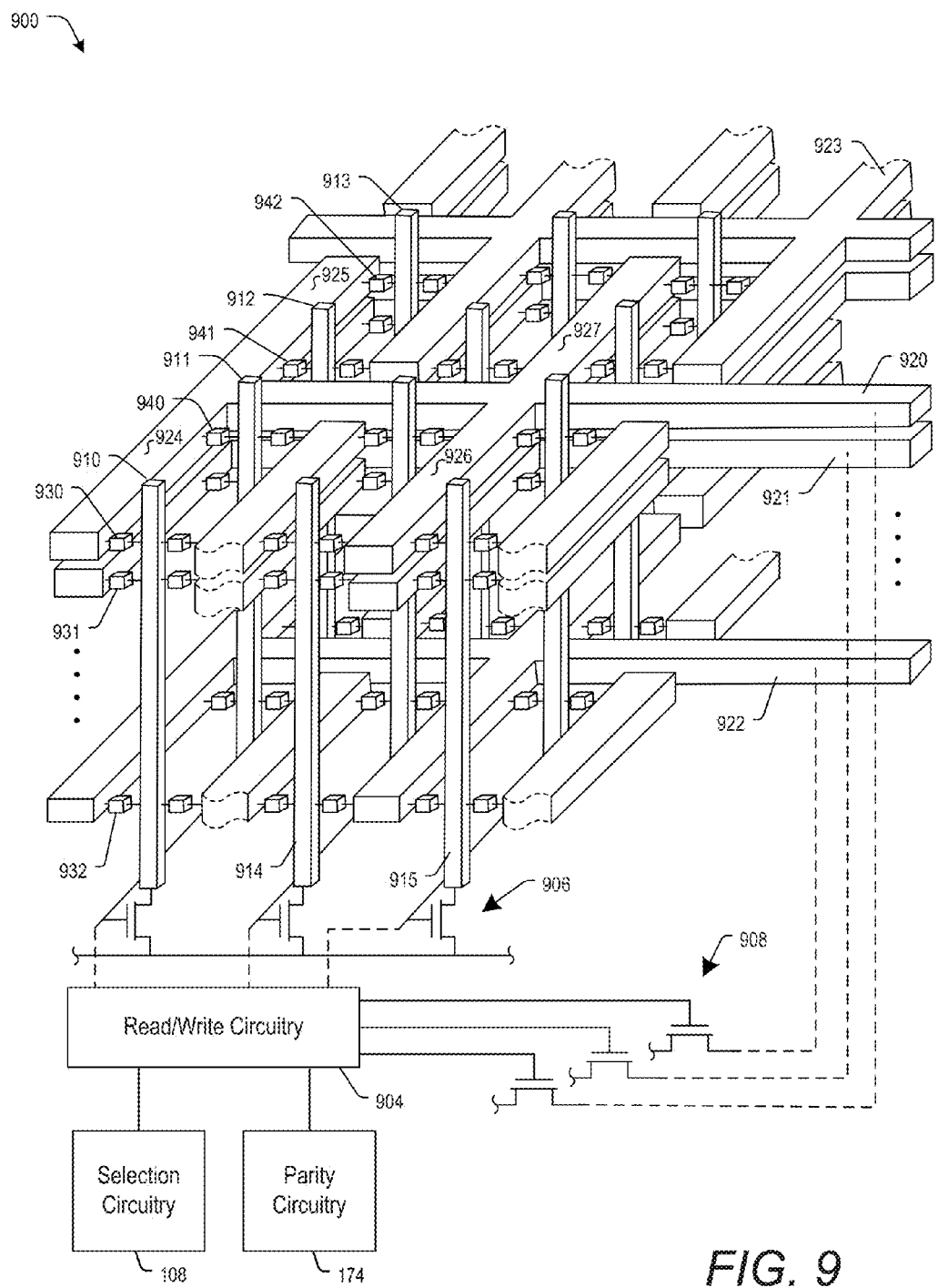
FIG. 9 is a block diagram of another particular embodiment of a memory that may be included in the data storage device of FIG. 1.

FIG. 9 is a diagram of a particular embodiment of a memory 900. The memory 900 may be included in the data storage device 102 of FIG. 1. For example, the memory 900 may correspond to the memory 104. The memory 900 may include the selection circuitry 108 of FIG. 1 and the parity circuitry 174 of FIG. 1 (e.g., in connection with an "in-memory" parity scheme). The selection circuitry 108 and the parity circuitry 174 are configured to operate (e.g., to select data and/or to perform parity operations) based on the string-based and group-based striping pattern 176 described with reference to FIG. 1.

In the embodiment illustrated in FIG. 9, the memory is a vertical bit line ReRAM with a plurality of conductive lines in physical layers over a substrate (e.g., substantially parallel to a surface of the substrate), such as representative word lines 920, 921, 922, and 923 (only a portion of which is shown in FIG. 9) and a plurality of vertical conductive lines through the physical layers, such as representative bit lines 910, 911, 912, and 913. The word line 922 may include or correspond to a first group of physical layers, and the word lines 920, 921 may include or correspond to a second group of physical layers.

The memory 900 also includes a plurality of resistance-based storage elements (e.g., memory cells), such as representative storage elements 930, 931, 932, 940, 941, and 942, each of which is coupled to a bit line and a word line in arrays of memory cells in multiple physical layers over the substrate (e.g., a silicon substrate). The memory 900 also includes read/write circuitry 904, such as the read/write circuitry 106 of FIG. 1. The read/write circuitry 904 is coupled to word line drivers 908 and bit line drivers 906.

In the embodiment illustrated in FIG. 9, each of the word lines includes a plurality of fingers (e.g., a first word line 920 includes fingers 924, 925, 926, and 927). Each finger may be coupled to more than one bit line. To illustrate, a first finger 924 of the first word line 920 is coupled to a first bit line 910 via a first storage element 930 at a first end of the first finger 924 and is coupled to a second bit line 911 via a second storage element 940 at a second end of the first finger 924.

In the embodiment illustrated in FIG. 9, each bit line may be coupled to more than one word line. To illustrate, the first bit line 910 is coupled to the first word line 920 via the first storage element 930 and is coupled to a third word line 922 via a third storage element 932.

During a write operation, the controller 170 of FIG. 1 may receive data from a host device, such as the host device 180 of FIG. 1. The controller 170 may send the data (or a representation of the data) to the memory 900. For example, the controller 170 may encode the data prior to sending the encoded data to the memory 900.

The read/write circuitry 904 may write the data to storage elements corresponding to the destination of the data. For example, the read/write circuitry 904 may apply selection signals to selection control lines coupled to the word line drivers 908 and the bit line drivers 906 to cause a write voltage to be applied across a selected storage element. For example, to select the first storage element 930, the read/write circuitry 904 may activate the word line drivers 908 and the bit line drivers 906 to drive a programming current (also referred to as a write current) through the first storage element 930. To illustrate, a first write current may be used to write a first logical value (e.g., a value corresponding to a high-resistance state) to the first storage element 930, and a second write current may be used to write a second logical value (e.g., a value corresponding to a low-resistance state) to the first storage element 930. The programming current may be applied by generating a programming voltage across the first storage element 930 by applying a first voltage to the first bit line 910 and to word lines other than the first word line 920 and applying a second voltage to the first word line 920. In a particular embodiment, the first voltage is applied to other bit lines (e.g., the bit lines 914, 915) to reduce leakage current in the memory 900.

During a read operation, the controller 170 may receive a request from a host device, such as the host device 180 of FIG. 1. The controller 170 may cause the read/write circuitry 904 to read bits from particular storage elements of the memory 900 by applying selection signals to selection control lines coupled to the word line drivers 908 and the bit line drivers 906 to cause a read voltage to be applied across a selected storage element. For example, to select the first storage element 930, the read/write circuitry 904 may activate the word line drivers 908 and the bit line drivers 906 to apply a first voltage (e.g., 0.7 volts (V)) to the first bit line 910 and to word lines other than the first word line 920. A lower voltage (e.g., 0 V) may be applied to the first word line 920. Thus, a read voltage is applied across the first storage element 930, and a read current corresponding to the read voltage may be detected at a sense amplifier of the read/write circuitry 904. The read current corresponds (via Ohm's law) to a resistance state of the first storage element 930, which corresponds to a logical value stored at the first storage element 930. The logical value read from the first storage element 930 and other elements read during the read operation may be provided to the controller 170.

Although the controller 170 and certain other components described herein are illustrated as block components and described in general terms, such components may include one or more microprocessors, state machines, and/or other circuits configured to enable the data storage device 102 (or one or more components thereof) to perform operations described herein. One or more components described herein may be operationally coupled using one or more nodes, one or more buses (e.g., data buses and/or control buses), one or more other structures, or a combination thereof. One or more components described herein may include one or more physical components, such as hardware controllers, state machines, logic circuits, one or more other structures, or a combination thereof, to enable the data storage device 102 to perform one or more operations described herein. As an illustrative example, the parity circuitry 174 may include logic gates, such as complementary metal-oxide-semiconductor (CMOS) logic gates, that are configured to perform XOR operations serially, in parallel, or a combination thereof.

Alternatively or in addition, one or more aspects of the data storage device 102 may be implemented using a microprocessor or microcontroller programmed (e.g., by executing instructions) to perform operations described herein, such as one or more operations of the method 500 of FIG. 5. In a particular embodiment, the data storage device 102 includes a processor executing instructions (e.g., firmware) retrieved from the memory 104. Alternatively or in addition, instructions that are executed by the processor may be retrieved from a separate memory location that is not part of the memory 104, such as at a read-only memory (ROM). One or more operations described herein as being performed by the controller 170 may be performed at the memory 104 (e.g., "in-memory" ECC operations, as an illustrative example) alternatively or in addition to performing such operations at the controller 170.

To further illustrate, the controller 170 may include a processor that is configured to execute instructions to perform certain operations described herein. The instructions may include general purpose instructions, and the processor may include a general purpose execution unit operable to execute general purpose instructions. The processor may access the instructions from the memory 104, an internal memory of the controller 170 (not shown), another memory location, or a combination thereof. The processor may execute the instructions to perform one or more operations described herein.

The data storage device 102 may be attached to or embedded within one or more host devices, such as within a housing of a host communication device (e.g., the host device 180). For example, the data storage device 102 may be integrated within an apparatus such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory. However, in other embodiments, the data storage device 102 may be implemented in a portable device configured to be selectively coupled to one or more external devices, such as the host device 180.

To further illustrate, the data storage device 102 may be configured to be coupled to the host device 180 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory 104 may include a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), a resistive random access memory (ReRAM), or a combination thereof. Alternatively or in addition, the memory 104 may include another type of memory. The memory 104 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A data storage device comprising:
    a non-volatile memory having a three-dimensional (3D) memory configuration, the non-volatile memory including:
        multiple word lines, the multiple word lines including a first word line, a second word line, and a third word line, wherein the first word line is adjacent to the second word line, and wherein the second word line is adjacent to the third word line; and
        multiple strings, the multiple strings including a first string and a second string, wherein the first string is adjacent to the second string; and
    selection circuitry configured to select a first set of data groups associated with the first word line and a second set of data groups associated with the third word line for a parity operation, wherein the first set of data groups includes a first data group associated with the first string and a second data group associated with the second string, and wherein the second set of data groups includes a third data group associated with the first string and a fourth data group associated with the second string.

2. The data storage device of claim 1, wherein the non-volatile memory further includes a first select gate drain (SGD) transistor associated with the first string and a second SGD transistor associated with the second string.

3. The data storage device of claim 1, wherein the first data group includes a first logical page stored at the first word line, wherein the second data group includes a second logical page stored at the first word line, wherein the third data group includes a third logical page stored at the third word line, and wherein the fourth data group includes a fourth logical page stored at the third word line.

4. The data storage device of claim 3, wherein the multiple word lines are multi-level cell (MLC) word lines, wherein the first logical page is included in a first set of MLC pages associated with the first string, wherein the second logical page is included in a second set of MLC pages associated with the second string, wherein the third logical page is included in a third set of MLC pages associated with the first string, and wherein the fourth logical page is included in a fourth set of MLC pages associated with the second string.

5. The data storage device of claim 4, wherein the MLC word lines are three-bit-per-cell (X3) MLC word lines.

6. The data storage device of claim 5, wherein the selection circuitry is further configured to operate based on a striping pattern that includes 24 stripes.

7. The data storage device of claim 4, wherein the MLC word lines are two-bit-per-cell (X2) MLC word lines.

8. The data storage device of claim 7, wherein the selection circuitry is further configured to operate based on a striping pattern that includes 16 stripes.

9. The data storage device of claim 1, further comprising parity circuitry coupled to the selection circuitry, wherein the parity circuitry is configured to perform the parity operation to generate groups of parity information using the first set of data groups and the second set of data groups.

10. The data storage device of claim 9, wherein the non-volatile memory further includes a dedicated storage region to store the groups of parity information.

11. The data storage device of claim 9, wherein the selection circuitry is further configured to select the first set of data groups and the groups of parity information to enable recovery of the second set of data groups in response to an uncorrectable error correcting code (UECC) event associated with the second set of data groups during decoding of one or more data groups of the second set of data groups.

12. The data storage device of claim 11, wherein the UECC event results from an electrical short between the second word line and the third word line, and wherein the selection circuitry is configured to operate according to a string-based and group-based striping pattern.

13. The data storage device of claim 11, wherein the multiple strings are parallel strings that extend from a first layer of the non-volatile memory to a second layer of the non-volatile memory.

14. The data storage device of claim 1, wherein the parity operation includes multiple exclusive-or (XOR) operations including a first XOR operation based on the first data group and the third data group and further including a second XOR operation based on the second data group and the fourth data group.

15. The data storage device of claim 1, wherein the 3D memory configuration is monolithically formed in one or more physical levels of arrays of memory cells having an active area above a silicon substrate, and further comprising circuitry associated with operation of the memory cells.

16. A method comprising:
    at a data storage device that includes a non-volatile memory having a three-dimensional (3D) memory configuration, wherein the non-volatile memory includes multiple word lines, the multiple word lines including a first word line, a second word line, and a third word line, wherein the first word line is adjacent to the second word line, wherein the second word line is adjacent to the third word line, wherein the non-volatile memory further includes multiple strings, the multiple strings including a first string and a second string, wherein the first string is adjacent to the second string, performing:

selecting a first set of data groups associated with the first word line for a parity operation, wherein the first set of data groups includes a first data group associated with the first string and a second data group associated with the second string; and selecting a second set of data groups associated with the third word line for the parity operation, wherein the second set of data groups includes a third data group associated with the first string and a fourth data group associated with the second string.

17. The method of claim 16, further comprising performing the parity operation, wherein performing the parity operation includes generating first parity information based on the first data group and the third data group and further includes generating second parity information based on the second data group and the fourth data group.

18. The method of claim 17, wherein the parity operation includes multiple exclusive-or (XOR) operations including a first XOR operation based on the first data group and the third data group and further including a second XOR operation based on the second data group and the fourth data group.

19. The method of claim 16, wherein selecting the first set of data groups and selecting the second set of data groups is performed by selection circuitry, and wherein the parity operation is performed by parity circuitry.

20. The method of claim 16, wherein the 3D memory configuration is monolithically formed in one or more physical levels of arrays of memory cells having an active area above a silicon substrate, and wherein the non-volatile memory includes circuitry associated with operation of the memory cells.

\* \* \* \* \*